US007129703B2

(12) United States Patent
Zappa

(10) Patent No.: US 7,129,703 B2
(45) Date of Patent: Oct. 31, 2006

(54) SAFETY SWITCH WITH AN ELECTRONIC PROGRAMMABLE SYSTEM

(75) Inventor: Roberto Zappa, Bergamo (IT)

(73) Assignee: Sematic Italia S.p.A., Bergamo (IT)

( * ) Notice: Subject to any disclaimer, the term of this patent is extended or adjusted under 35 U.S.C. 154(b) by 595 days.

(21) Appl. No.: 10/632,353

(22) Filed: Jul. 31, 2003

(65) Prior Publication Data

US 2004/0032250 A1 Feb. 19, 2004

(30) Foreign Application Priority Data

Jul. 31, 2002 (IT) ...................... MI2002A001718

(51) Int. Cl.
*G01R 33/00* (2006.01)
*G01R 33/038* (2006.01)
*H01H 83/00* (2006.01)

(52) U.S. Cl. ........................................ 324/260; 307/116

(58) Field of Classification Search ................ 324/260; 307/116

See application file for complete search history.

(56) References Cited

U.S. PATENT DOCUMENTS 6,032,004 A * 2/2000 Mirabella et al. ............. 399/90
6,847,204 B1 * 1/2005 Duance ................... 324/207.2
2002/0104266 A1 * 8/2002 Ranaudo ...................... 49/334

* cited by examiner

*Primary Examiner*—Bot LeDynh
(74) *Attorney, Agent, or Firm*—Abelman, Frayne, Schwab

(57) ABSTRACT

A safety switch with an electronic programmable system including a group of two single-contact relays connected in series, associated with a matching element, a proximity element associated with a support element, magnetic sensors to check the contact status of each of the two relays, two calculation units connected to an exit to the magnetic sensors through the relative control signal connectors and to one entry by a common connector and a magnet associated with the proximity element, with the checking of the status of the relays being managed by the calculation units and taking place by sending a fixed number of fixed-frequency pulse width modulation pulses to the magnetic sensors of each of the single-contact relays and through the connectors and checking the return of the same pulses through the common connector.

20 Claims, 9 Drawing Sheets

SAFETY SWITCH WITH AN ELECTRONIC PROGRAMMABLE SYSTEM

BACKGROUND OF THE INVENTION

1. Field of the Invention

The present invention refers to a safety switch with an electronic programmable system.

More particularly, the present invention refers to a safety switch with an electronic programmable system being particularly but not exclusively useful anytime that the need to be sure that an element reaches a certain position with respect to another one arises, such as for the bolts of lift doors.

2. Description of the Related Art

It is known that in various applications it is necessary to be sure that an element reaches a predefined position with respect to another one before the subsequent event takes place. One of these applications is the control of the bolts of lift doors wherein their opening and/or closing must take place safely according to the provisions ruling the security classes.

In order to meet these safety requirements, mechanical devices provided with electric or electromechanical sensors interacting with the opening devices of the doors are generally known and used. In particular, for safety reasons, the bolt of the lift doors is associated with the lift cabin operator and it is mechanically operated.

Even though these devices achieve the purpose, they are not free from drawbacks such as the manufacturing complexity due to the interaction needed between the electrical and the mechanical devices, the installation difficulty due to the restricted spaces available, the physical calibration needed of the various component in order to assure the correct interaction among the above-mentioned devices.

BRIEF SUMMARY OF THE INVENTION

An object of the present invention is to provide a safety switch with an electronic programmable system being able to remove the above-mentioned drawbacks with reference to the prior art.

A further object of the present invention is to provide a safety switch with an electronic programmable system that is easily manufactured and installed in restricted spaces and does not need physical calibration.

According to the present invention, these and other purposes resulting from the following description will be attained by a safety switch with an electronic programmable system.

BRIEF DESCRIPTION OF THE SEVERAL VIEWS OF THE DRAWINGS

The building and functional features of the safety switch with an electronic programmable system of the present invention will be better understood from the following description, wherein reference is made to the Figures of the attached drawings representing an embodiment of the device which is given only by way of illustrative and non-limitative example wherein.

DETAILED DESCRIPTION OF THE INVENTION

Figure 1:
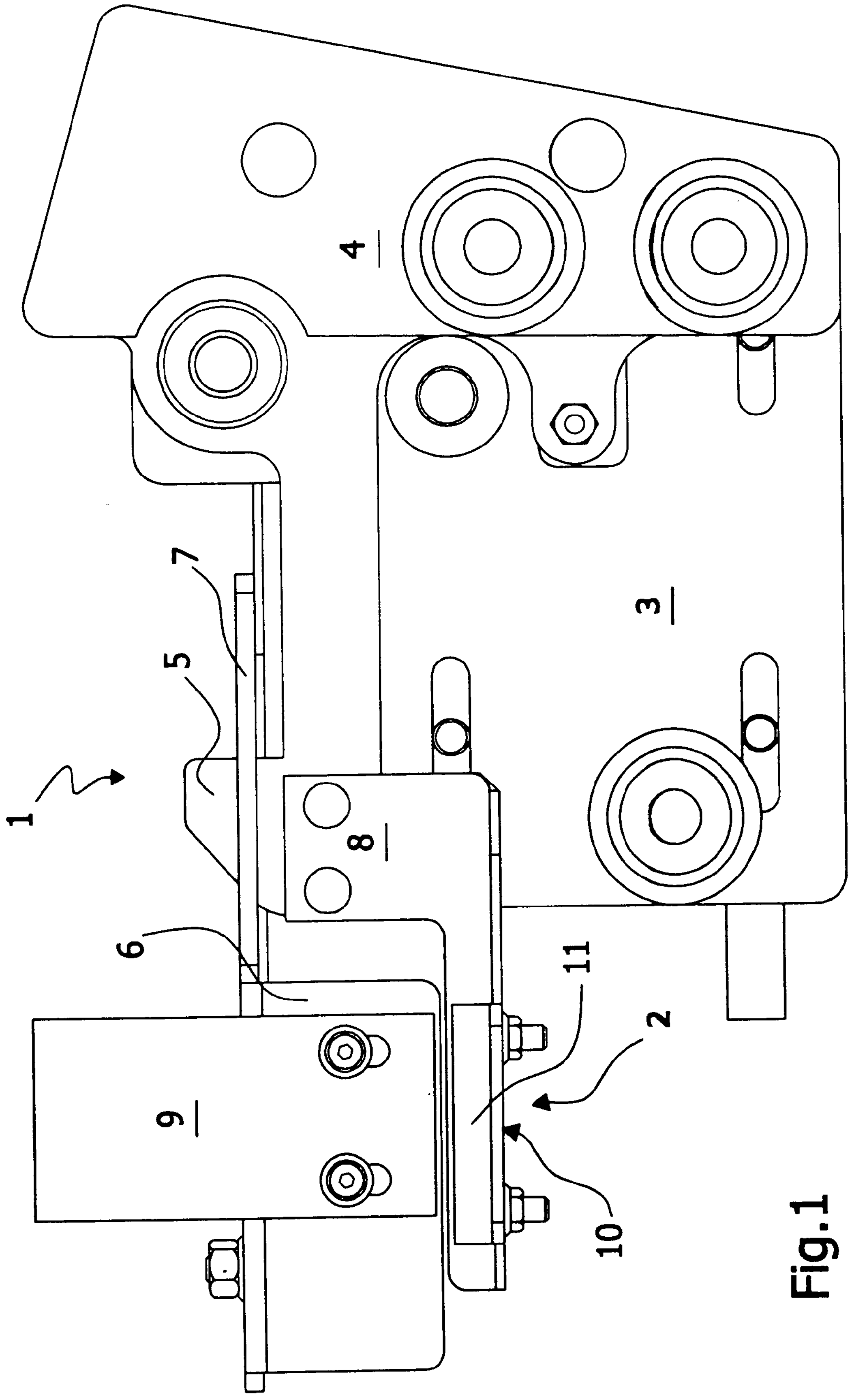
FIG. 1 is a schematic view of a door bolt provided with the safety switch with the electronic programmable system of the present invention.

With reference to FIG. 1, a door bolt provided with a safety switch with an electronic programmable system 2 of the present invention is marked in its whole by 1.

The door bolt 1, which is known in itself and therefore it is not described in detail, comprises a support element 3, and a tilting element 4 provided with stopping means, that are rotatingly associated with the support element 3 and to a matching element 6 provided with stopping opposite means 7.

Moreover, the tilting element 4 is provided with a support element 8.

The safety switch with the electronic programmable system 2 comprises a group of two single-contact relays 9 connected in series, associated with the matching element 6 and a proximity element 10 associated with the support element 8 of the tilting element 4.

The relay group 9 is provided with magnetic sensors to check the contact status of each of the two relays of two calculation units. These magnetic sensors are sensitive to the orientation of the flow lines of the surrounding magnetic field.

The proximity element 10 is provided with a magnet 11 that is able to generate a magnetic field variation that can be detected by the magnetic sensors. The magnetic field variation is a function of the distance of the magnet 11, associated with the tilting element 4, from the magnetic sensors 11 associated with the group of the two relays 9.

Figure 2:
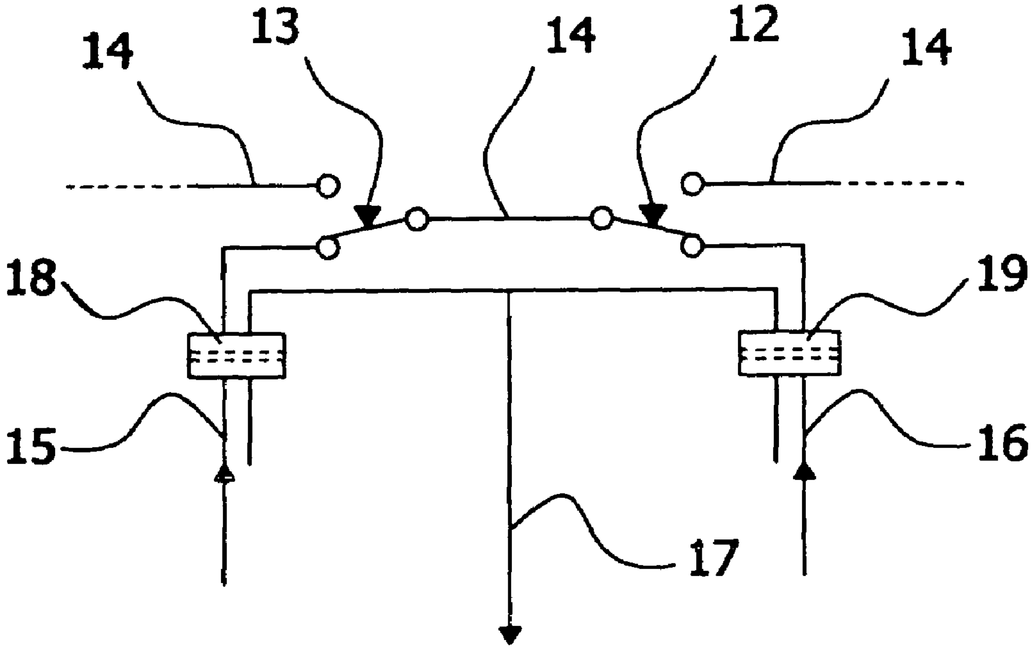
FIG. 2 is a check diagram of the relay status.

The control of the relay status defining the position of the bolt and therefore the safety of the switch is carried out as shown in FIG. 2 using only the NA contact. It can be noticed that, in this scheme, the only contact 12 and 13 of the single relays, the power connectors 14, the connectors of the control signals 15 and 16 and the connector 17 common to the two relays are shown. Two transformers 18 and 19 assure the insulation of the safety circuit.

The connectors of the control signals 15 and 16 are connected to one end with one output of one relative calculation unit of the two calculation units and to the other end with the magnetic sensors of a relative relay. The common connector 17 is connected to one end with the magnetic sensors of the two relays and to the other one with an entry of the two calculation units.

The control is managed by the two calculation units of the safety switch and takes place by sending a fixed number of pulse width modulation (pwm) fixed-frequency pulses to each of the magnetic sensors of the single-contact relays 12 and 13 through the connectors 15 and 16 and controlling the return of the same pulses through the connector 17. As these pulses are in common with the return connector 17, they are alternatively sent to the magnetic sensors of the two single-contact relays 12 and 13; in other words, first to one magnetic sensor and then to the other. The pwm pulses have preferably a frequency of 50 KHz divided into packets of 1 second for a total of 50 pulses for each audit window. Between the sending of the pulses to the magnetic sensor of the first single-contact relay and the sending to the magnetic sensor of the second single-contact relay, a delay time of the line engaged is advantageously left. Moreover, the time of the control cycle is advantageously divided at 50% on the two single-contact relays.

The two calculation units can determine the status of the contacts of the single relays from the return of the pulses; in other words if the pulses sent to the magnetic sensor of both the single contact relays 12 and 13 return, both the single-contact relays are closed; or if they do not return they are open. In this way, the two calculation units can give the permission to the movement of the cabin, in case of a lift; or deny it enabling an alarm signal.

Figure 3:
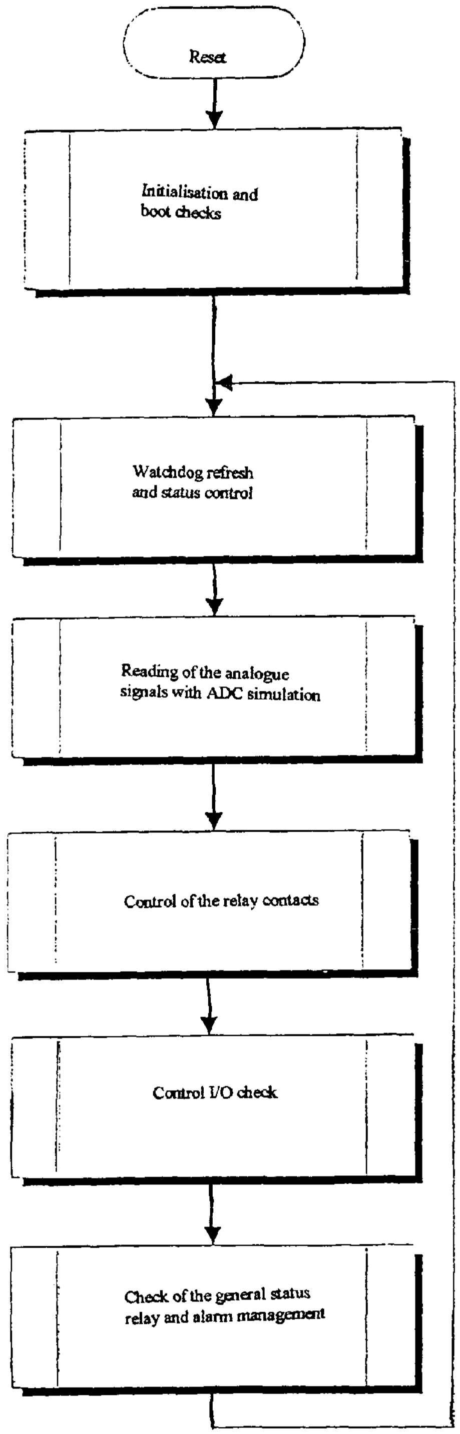
FIGS. 3 to 11 represent the managing software flow chart of the safety switch with the electronic programmable system of FIG. 1.

In FIG. 3 the flow chart of the initialization cycle and of the main cycle of the management software of the safety switch with the electronic programmable system 2 is shown.

Figure 4:
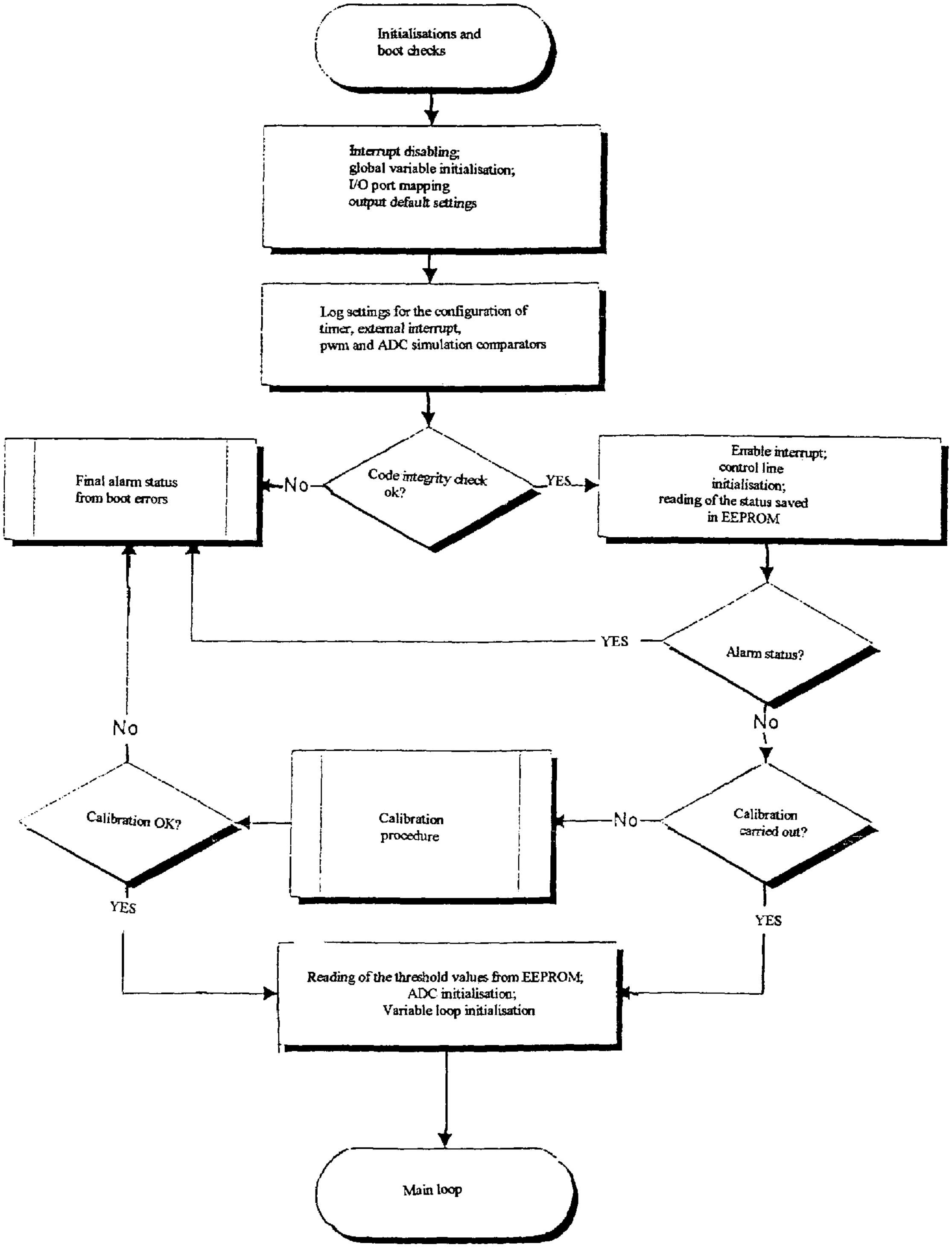

The initialization cycle is represented in detail in FIG. 4 and it mainly comprises the initialization and control configuration steps, the error check and the execution and, during testing, the calibration procedure.

Figure 5:
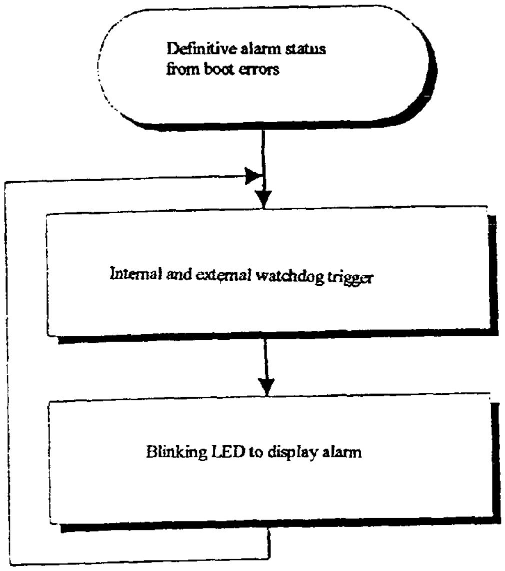

FIG. 5 shows the alarm cycle that is forced in case of errors during the initialization step.

Figure 6:
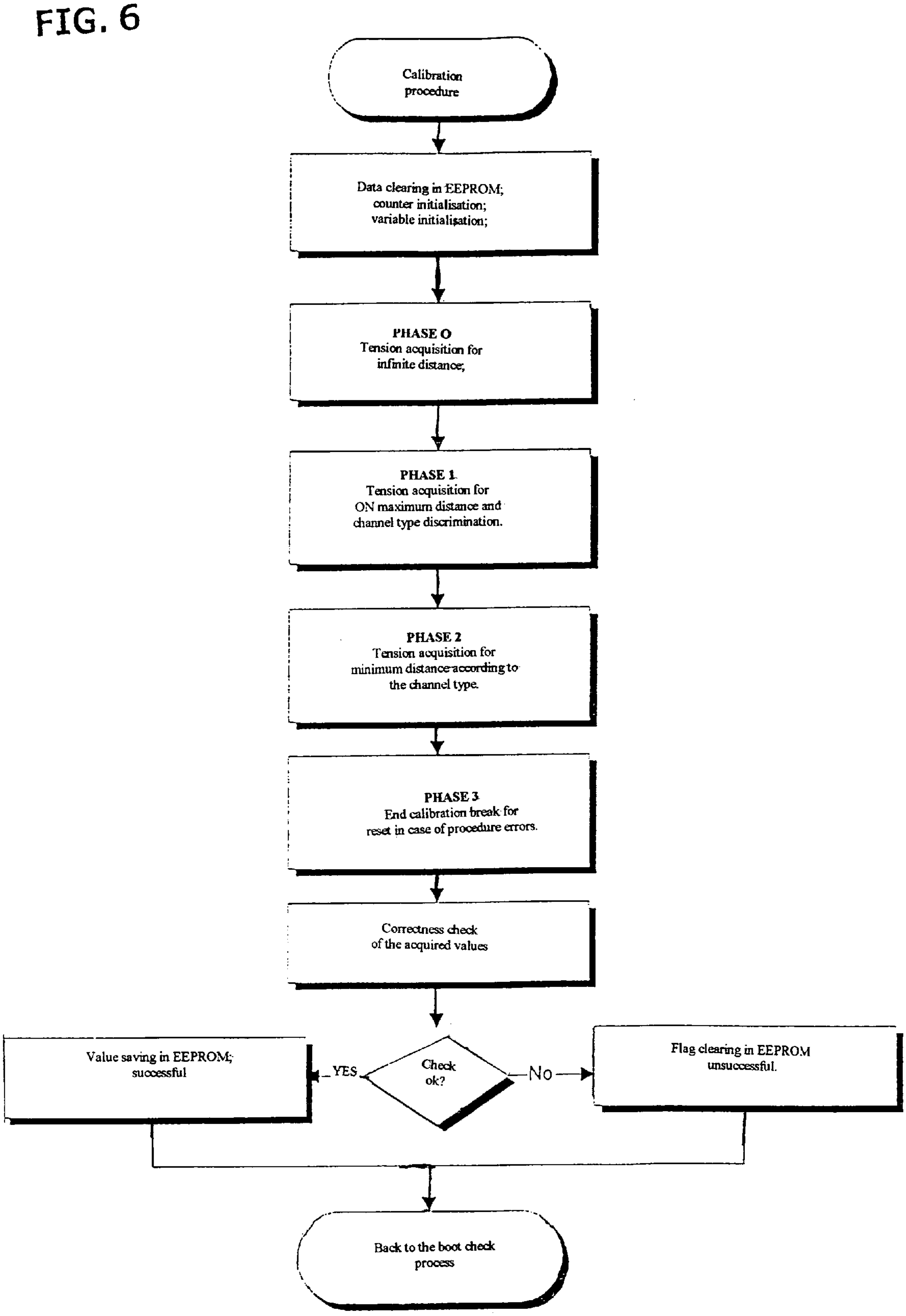
Figure 7:
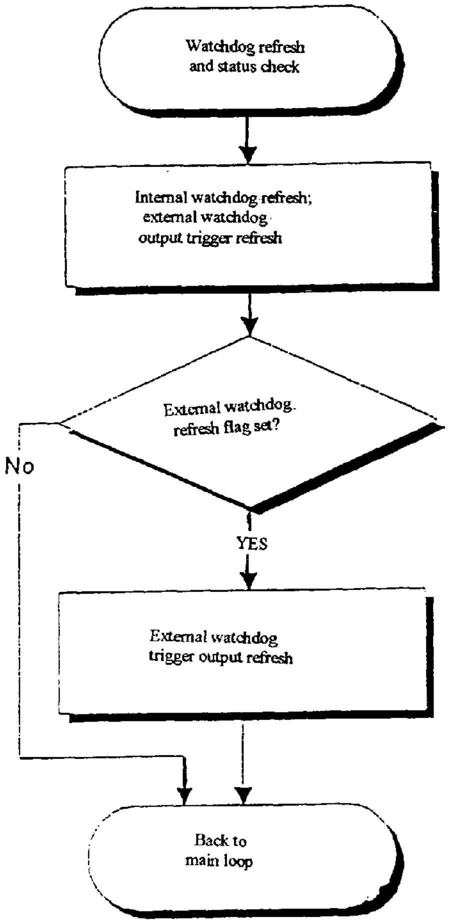
Figure 8:
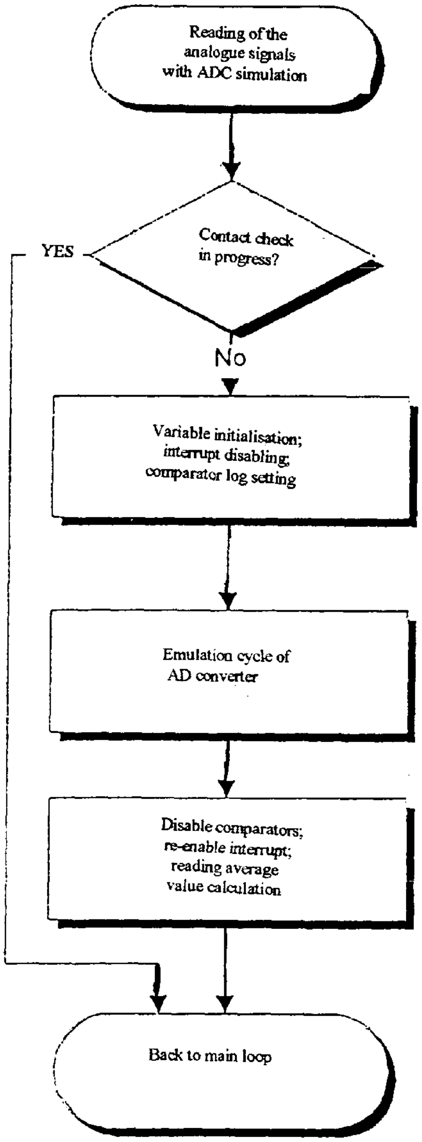

FIG. 6 shows the flow chart of the calibration procedure comprising the acquisition steps of all the reference and control values.

Figure 9:
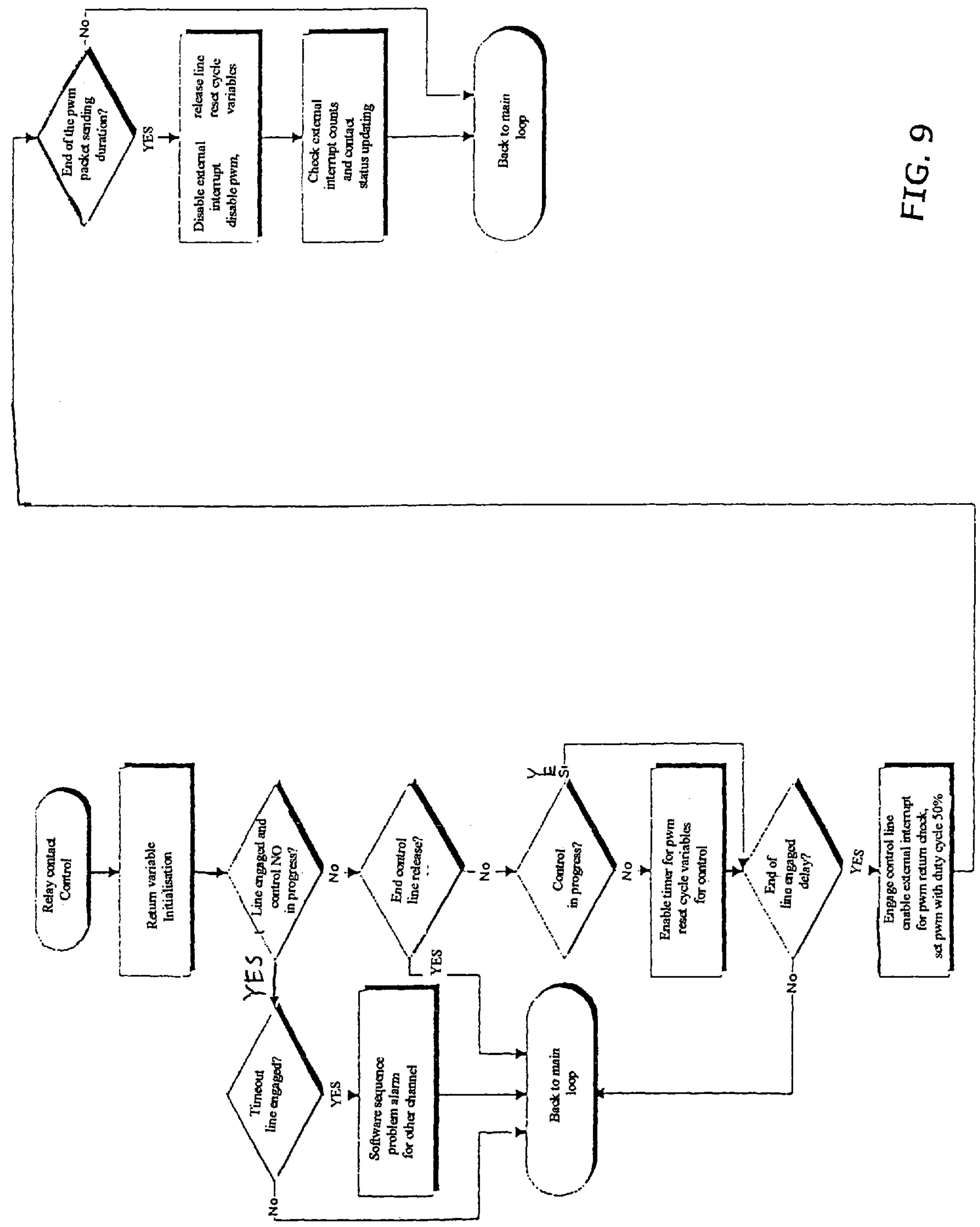
Figure 10:
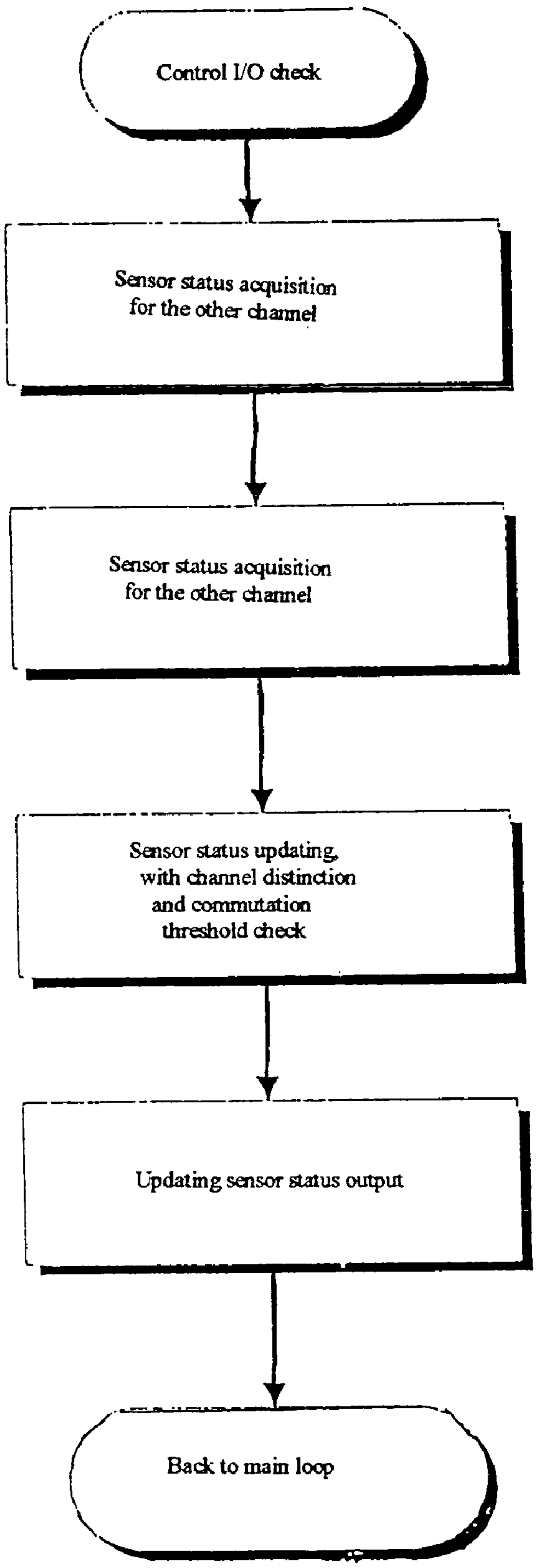
Figure 11:
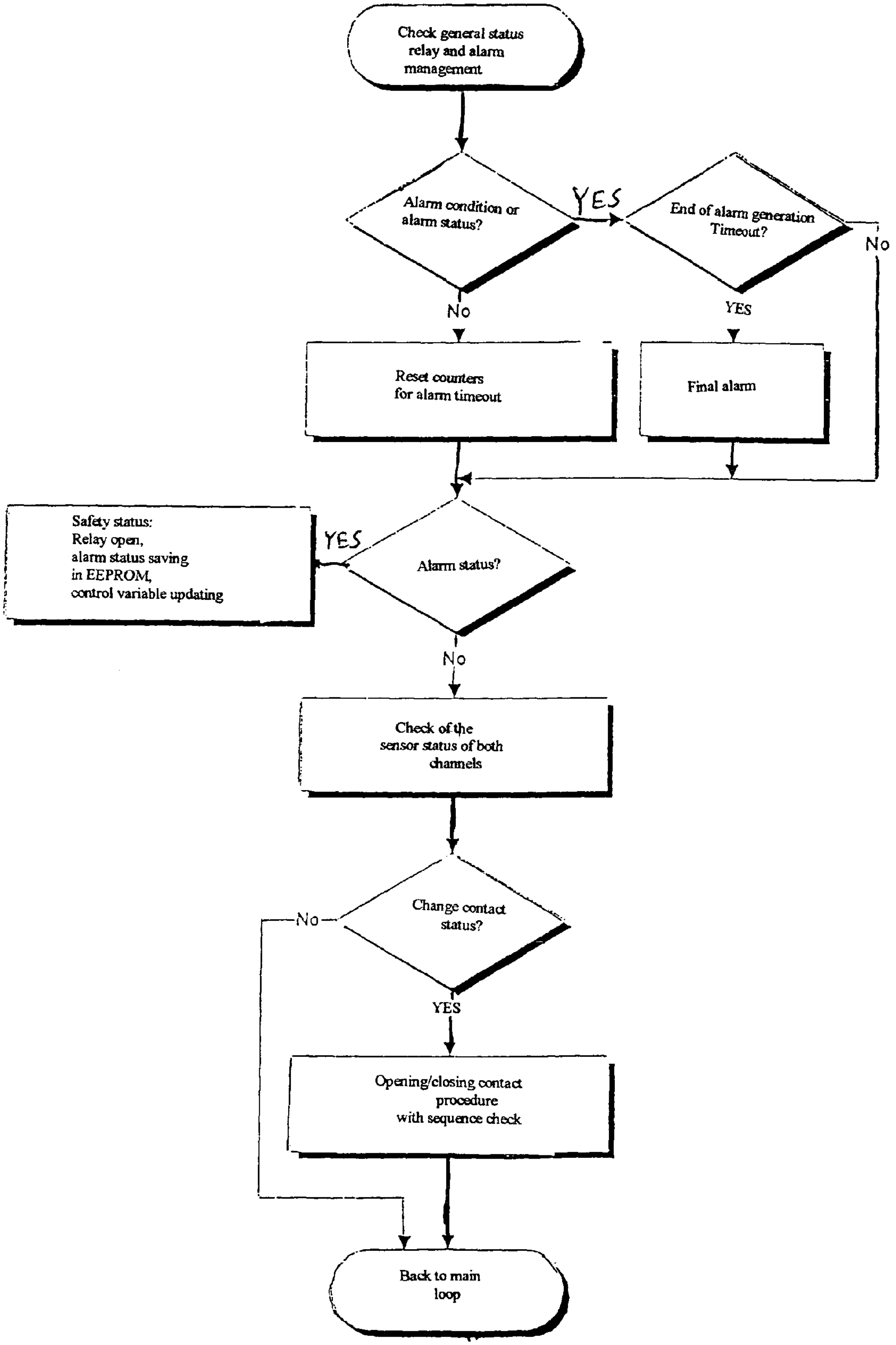

FIGS. 7 to 11 show in detail the management steps of the switch and, in particular, FIG. 9 shows a flow chart of the control of the single-contact relays.

Advantageously, the safety switch with the electronic programmable system of the present invention does not need physical calibrations as all the management and control parameters are defined and acquired by an appropriate program block executed at the first start.

The safety switch with the electronic programmable system of the present invention can be advantageously used each time that an element must be in a certain position before the permission to the subsequent action is given such as in machine tools wherein protections must be safely closed before starting the working cycle.

As it can be noticed form the previous description, the safety switch with the electronic programmable system of the present invention is functional and versatile; moreover it can be easily manufactured at low costs thus allowing the attainment of its purpose and overcome the above-mentioned drawbacks with reference to the prior art.

Even though the present invention has been described above with reference to an illustrative embodiment, which is given only by way of non-limitative example, it is clear that technicians skilled in the art can make various changes and variants according to the above-mentioned description. It is therefore understood that the present invention is meant to include all the changes and variants falling within the spirit and the protective scope of the following claims.

What is claimed is:

1. A safety switch with an electronic programmable system (2) comprising:

- a group of two single-contact relays (9) connected in series, associated with a matching element (6);
- a proximity element (10) associated with a support element (8);
- magnetic sensors for the check of the contact status of each of the two single-contact relays (9);
- two calculation units connected to an output of the magnetic sensors through a respective one of a plurality of control signal connectors (15, 16) and to one input by a common connector (17); and
- a magnet (11) associated with the proximity element (10);
- wherein the checking of the contact status of the single-contact relays (9) is managed by the calculation units with the checking occurring by sending a fixed number of fixed-frequency pulse width modulation (PWM) pulses to the magnetic sensors of each of a pair of single-contact relays (12, 13) through the connectors (15, 16) and by checking the return of the same pulses through the common connector (17).

2. The safety switch with the electronic programmable system (2) according to claim 1 wherein the magnetic sensors are sensitive to the orientation of the flow lines of the surrounding magnetic field.

3. The safety switch with the electronic programmable system (2) according to claim 1 wherein the magnet (11) generates a magnetic field variation detectable the magnetic sensors.

4. The safety switch with the electronic programmable system (2) according to claim 3 wherein the magnetic field variation is a function of the distance of the magnet (11) from the magnetic sensors.

5. The safety switch with the electronic programmable system (2) according to claim 1 wherein the PWM pulses are alternatively sent to the magnetic sensor of the two single-contact relays (12, 13).

6. The safety switch with the electronic programmable system (2) according to claim 5 wherein the PWM pulses have frequency of 50 kHz divided into packets of one-second duration for a total of 50 pulses for each audit window.

7. The safety switch with the electronic programmable system (2) according to claim 6 wherein, between the sending of the pulses to the magnetic sensor of a first single-contact relay, a line-engaged delay time remains.

8. The safety switch with the electronic programmable system (2) according to claim 7 wherein a time of a control cycle is divided at 50% on the two single-contact relays.

9. The safety switch with the electronic programmable system (2) according to claim 1 wherein management and control parameters are acquired by a program block executed at the start of the electronic programmable system (2).

10. The safety switch with the electronic programmable system (2) according to claim 2 wherein the magnet (11) generates a magnetic field variation detectable the magnetic sensors.

11. The safety switch with the electronic programmable system (2) according to claim 10 wherein the magnetic field variation is a function of the distance of the magnet (11) from the magnetic sensors.

12. The safety switch with the electronic programmable system (2) according to claim 10 wherein the PWM pulses are alternatively sent to the magnetic sensor of the two single-contact relays (12, 13).

13. The safety switch with the electronic programmable system (2) according to claim 11 wherein the PWM pulses are alternatively sent to the magnetic sensor of the two single-contact relays (12, 13).

14. The safety switch with the electronic programmable system (2) according to claim 10 wherein the PWM pulses have frequency of 50 kHz divided into packets of one-second duration for a total of 50 pulses for each audit window.

15. The safety switch with the electronic programmable system (2) according to claim 11 wherein the PWM pulses have frequency of 50 kHz divided into packets of one-second duration for a total of 50 pulses for each audit window.

16. The safety switch with the electronic programmable system (2) according to claim 12 wherein the PWM pulses have frequency of 50 kHz divided into packets of one-second duration for a total of 50 pulses for each audit window.

17. The safety switch with the electronic programmable system (2) according to claim 13 wherein the PWM pulses have frequency of 50 kHz divided into packets of one-second duration for a total of 50 pulses for each audit window.

18. The safety switch with the electronic programmable system (2) according to claim 10 wherein, between the sending of the pulses to the magnetic sensor of a first single-contact relay, a line-engaged delay time remains.

19. The safety switch with the electronic programmable system (2) according to claim 11 wherein, between the sending of the pulses to the magnetic sensor of a first single-contact relay, a line-engaged delay time remains.

20. The safety switch with the electronic programmable system (2) according to claim 12 wherein, between the sending of the pulses to the magnetic sensor of a first single-contact relay, a line-engaged delay time remains.

* * * * *